United States Patent [19]

Olsson et al.

[11] Patent Number: 4,632,552
[45] Date of Patent: Dec. 30, 1986

[54] CLEAVED-COUPLED-CAVITY-LASER-DRIVEN SYSTEM FOR MEASURING SMALL SIGNALS

[75] Inventors: Nils A. Olsson, New Providence; Yan-Chi Shi, Parsippany, both of N.J.

[73] Assignee: AT&T Bell Laboratories, Murray Hill, N.J.

[21] Appl. No.: 708,962

[22] Filed: Mar. 6, 1985

[51] Int. Cl.$^4$ ............... G01B 9/02; H01S 3/13
[52] U.S. Cl. ............... 356/345; 250/205; 372/32
[58] Field of Search ............ 356/345; 372/31, 32, 372/33; 250/205

[56] References Cited

PUBLICATIONS

"Signal Stabilization of Optical Interferometric Hydrophones by Tuning the Light Source", *Applied Optics*, P. Shajenko et al., Jun. 15, 1980, pp. 1895–1897.
"Active Stabilization of a Michelson Interferometer by an Electrooptically Tuned Laser", *Applied Optics*, A. Olsson et al., Jun. 15, 1980, pp. 1897–1899.
"Direct Frequency Modulation in AlGaAs Semiconductor Lasers", *IEEE Journal of Quantum Electronics*, S. Kobayashi et al., 1982, pp. 582–595.
"High-Speed Direct Single-Frequency Modulation with Large Tuning Rate and Frequency Excursion in Cleaved-Coupled-Cavity Semiconductor Lasers", *Applied Physics Letters*, W. T. Tsang, Apr. 15, 1983, pp. 650–652.
"Active Spectral Stabilization of Cleaved-Coupled-Cavity (C$^3$) Lasers", *Journal of Lightwave Technology*, N. A. Olsson et al., Feb. 1984, pp. 49–51.

*Primary Examiner*—Vincent P. McGraw
*Attorney, Agent, or Firm*—Charles Scott Phelan

[57] ABSTRACT

A laser-driven interferometric signal sensing system has a cleaved-coupled cavity laser with separate stabilization servo loops of different time constants for the modulator and laser sections thereof. The laser section is biased above lasing threshold, and its stabilization loop is operated at a frequency twice the frequency of laser section bias current modulation. A laser loop feedback error signal is a function of predetermined, environmental-type, parameter variations in the sensing location and is processed to be a function of the second derivative of interferometer output intensity with respect to laser section current. That error signal is applied to modify laser section bias current in a direction to zero out the feedback signal.

7 Claims, 4 Drawing Figures

CLEAVED-COUPLED-CAVITY-LASER-DRIVEN SYSTEM FOR MEASURING SMALL SIGNALS

FIELD OF THE INVENTION

This invention relates to optical interferometric systems for measuring small signals, and it relates in particular to such systems for detecting such signals in the presence of environmental fluctuations which tend to cause the unstable operation of the systems.

BACKGROUND OF THE INVENTION

Lightguide fibers, or optical fibers, respond to certain temperature or pressure variations by producing small corresponding changes in the phase of light signals being transmitted therethrough. Those phase changes are effective changes in the signal path length due to the index of refraction change in the lightguide fiber. It is useful to induce effective path length changes in order to detect pressure changes representing effects that may be of interest; but signals which induce those changes are often so small that they may be at least partly masked by the sensitivity fluctuation of the interferometer due to the ambient, or environmental, temperature or pressure effects varying at a relatively low frequency compared to the frequency of signals which are to be detected.

P. Shajenko et al. propose in "Signal Stabilization of Optical Interferometric Hydrophones by Tuning the Light Source," *Applied Optics,* Vol. 19, No. 12, June 15, 1980, pages 1895–1897, a laser-driven optical interferometer. That system employs a stabilization feedback loop for adaptively tuning the laser to compensate for instability tendencies caused by low frequency, thermal and static, pressure fluctuations. Moving parts are required for changing the cavity size of the helium-neon laser that is used in the proposal, and the entire apparatus is relatively large and cumbersome.

An implementation of the Shajenko et al. proposal using an argon-pumped rhodamine 6G dye laser with an electrooptic tuner and a Michelson interferometer is disclosed in "Active Stabilization of a Michelson Interferometer by an Electrooptically Tuned Laser," by A. Olsson et al., *Applied Optics,* Vol. 19, No. 12, June 15, 1980, pages 1897–1899. A feedback signal from the interferometer, at the same frequency as a modulation signal applied to the laser, is used to tune the laser over a range much larger than that of the laser contemplated by Shajenko et al., but again the apparatus is large and cumbersome. Also, typical dye laser lifetime is less than a year.

Physical size is an important consideration in many measuring and sensing applications such as manufacturing operations, or operation of robotic equipment, or undersea geophysical prospecting, in all of which it is necessary to detect minute displacements in small, difficult to reach locations. In these kinds of applications it is often advantageous to have an entire sensing apparatus close to a sensing head so that a local microprocessor can perform necessary measured signal processing and transmit only final result signals back to a central control site. Apart from size, electric power requirements of measuring apparatus are also important considerations. Laser apparatus in each of the aforementioned systems is too large to be incorporated into a small, difficult to reach, measuring situation, and each consumes so much power that heat removal may be a problem in confined locations.

Semiconductor diode lasers of the single section type are much smaller, and consume less power, than the foregoing types of lasers and are conveniently tunable by modification of laser bias current. Examples of such tunable lasers are mentioned in "Direct Frequency Modulation in AlGaAs Semiconductor Laser," by S. Kobayashi et al., *IEEE Journal of Quantum Electronics,* Vol. QE-18, No. 4, 1982, pages 582–595. Although a semiconductor laser measuring system could be packaged in a much smaller size than the other laser systems previously mentioned (because the semiconductor laser itself is only the size of a pin head) and would consume only about $10^{-3}$ as much power, such lasers are known to be characterized by a short coherence length, e.g., one millimeter or less, which is too short to be used in a practical interferometric sensor.

In "High-Speed Direct Single-Frequency Modulation With Large Tuning Rate and Frequency Excursion in Cleaved-Coupled-Cavity Semiconductor Laser" by W. T. Tsang et al., *Applied Physics Letters, Vol.* 42, No. 8, Apr. 15, 1983, pages 650–652, the tunability of the so-called $C^3$ laser is discussed. Changes of current in a modulation section of the laser, cause the frequency of the laser to change; and a corresponding change in wavelength occurs. A tuning range of about half of the spectral width of the gain profile of the laser results, i.e., about 4 kilogigahertz (kGHz) at 1.5 $\mu$m wavelength. Frequency modulator applications were contemplated by the authors.

A $C^3$ laser is stabilized against slow environmental fluctuations and changes due to normal aging of the laser diode as described by N. A. Olsson et al. in "Active Spectral Stabilization of Cleaved-Coupled-Cavity ($C^3$) Lasers," *Journal of Lightwave Technology,* Vol. LT-2, No. 1, February 1984, pages 49–51. A stabilization feedback loop is applied to the modulator section of the laser to increase the ranges of temperature and ranges of laser section drive current for which the laser can be operated in a stable single mode, i.e., without mode hopping.

SUMMARY OF THE INVENTION

The foregoing heat and power problems with interferometric applications of lasers are reduced by applying stabilizing feedback loops to both a modulator section and a laser section of a $C^3$ laser. The modulator section loop is biased below lasing threshold and arranged to be responsive to the first derivative of its light output with respect to its current to maintain the optimum modulator current for a selected longitudinal mode of laser operation. The laser section loop is biased above lasing threshold and arranged in an interferometric measuring loop to be responsive to the second derivative of the interferometer light output with respect to laser section current to maintain the optimum laser section current for stable and maximum sensitivity, i.e., a quadrature operating point.

BRIEF DESCRIPTION OF THE DRAWINGS

A more complete understanding of the invention and its various features, objects, and advantages may be obtained from a consideration of the following detailed description and the appended claims in connection with the attached drawing in which:

DETAILED DESCRIPTION

Figure 1:
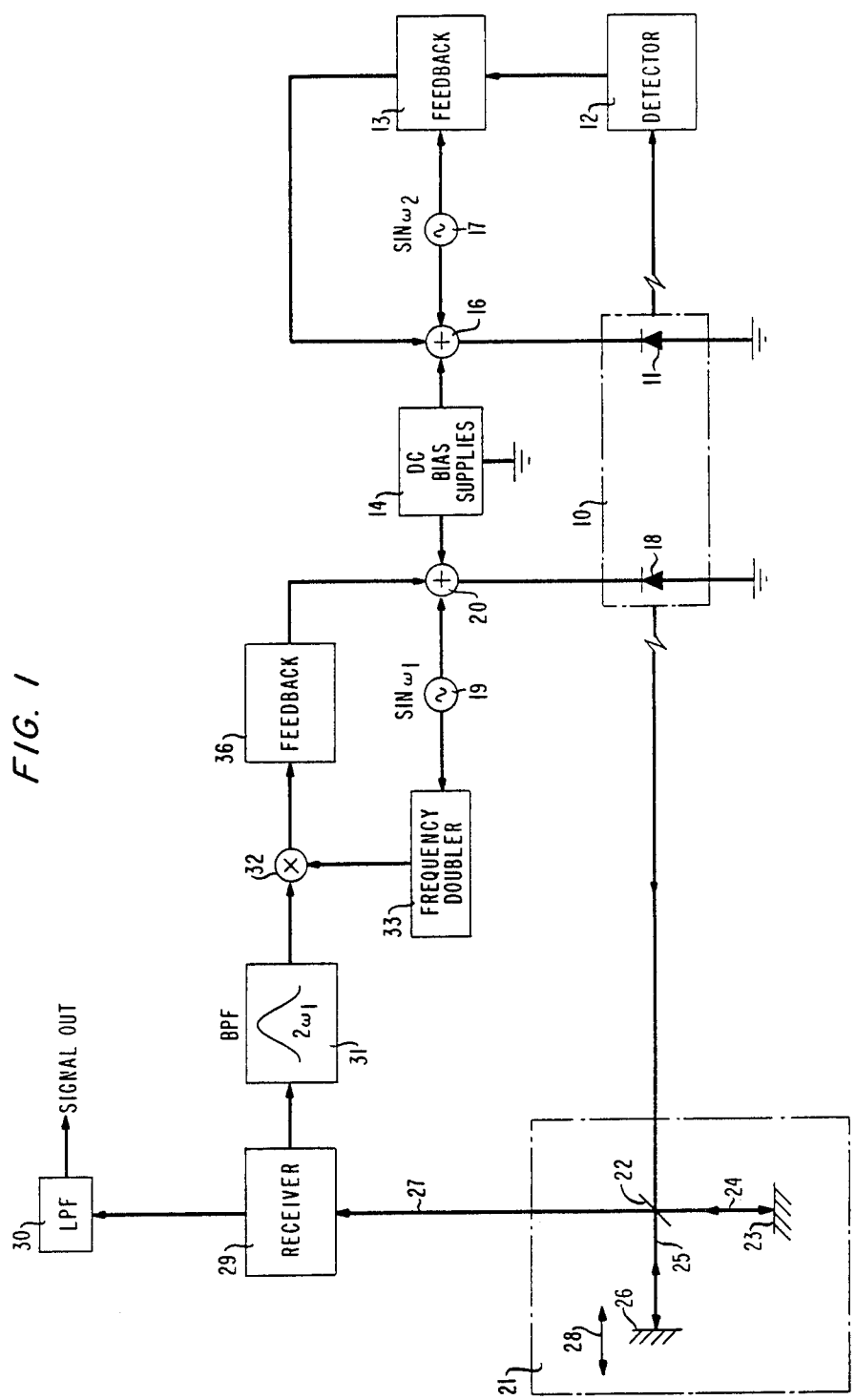
FIG. 1 is a functional block diagram of a $C^3$ laser measuring system in accordance with the invention.

In the functional diagram of FIG. 1, the individual components are all well-known and require no detailed description. A $C^3$ laser 10 provides the coherent light used in the measuring system illustrated. A modulator section diode 11 in that laser is connected in a stabilizing feedback loop including a light detector 12, an electrical feedback circuit 13, and an analog signal summing circuit 16. Diode 11 is biased below its lasing threshold in that loop by an output of direct current biasing supplies 14. The feedback loop and a modulating signal source 17, for a $C^3$ laser, are described in the aforementioned Olsson et al. paper of February 1984. The teachings of that paper are based upon a copending U.S.A. patent application of N. A. Olsson and W. T. Tsang, Ser. No. 494,275, filed May 13, 1983, entitled "Stabilized Cleaved-Coupled Cavity Laser" and assigned to the same assignee as the present application. The Olsson et al. application disclosure is hereby incorporated herein by reference as though fully set forth herein. Parts of that disclosure are outlined herein to assist the reader in understanding the present invention.

Light output from diode 11 is converted to a corresponding electrical signal by the detector 12 and applied to the feedback circuit 13. The sin $\omega_2$ output of source 17 is applied to both feedback circuit 13 and the summing circuit 16. In the latter circuit the modulating signal causes a small sinusoidal variation in diode 11 light output power and a corresponding variation in the electrical output amplitude of detector 12. Feedback circuit 13 includes a lock-in amplifier function which includes selection of the $\omega_2$ frequency component in the output of detector 12, mixing of that component and output of source 17, and an integration function for producing a direct current error signal which is proportional to the first derivative of modulator section light output power with respect to modulator current.

That error signal is positive, negative, or zero, depending upon the current of modulator section operation with respect to an optimum current for its present longitudinal mode of operation. The error signal is coupled back through summing circuit 16, where it is added to the output of source 17, to diode 11. The result is to maintain operation of laser diode 11 at an optimal current for the selected wavelength in spite of diode aging and changes in the ambient temperature around that diode. The frequency of the source 17 output is advantageously in the megahertz range to cause stabilization to take place sufficiently rapidly to allow the sensing system electronics portion of FIG. 1 to be shared by multiple optical sensing portions. For the convenience of the reader, the modulator section diode output power versus current diagram of the Olsson et al. paper is reproduced herein as FIG. 2.

Figure 2:
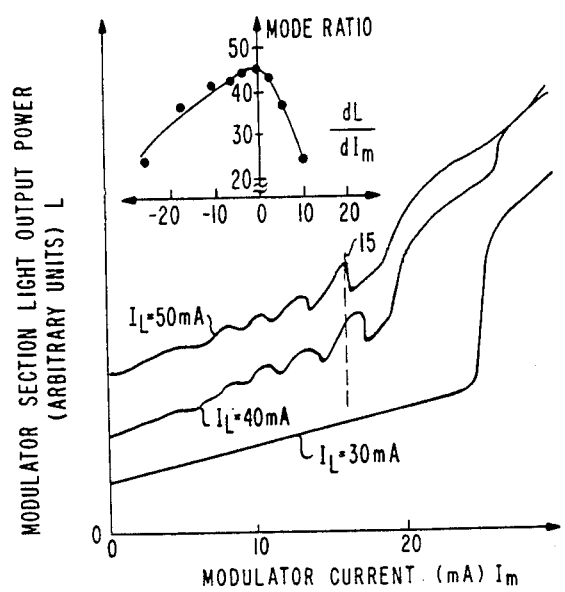
FIG. 2 is a modulator section light output power versus modulator current diagram for facilitating an understanding of the invention.

In FIG. 2 the current, in milliamperes (mA), through the modulator section is plotted horizontally versus the modulator section light output power, vertically, in arbitrary units from an InGaAsP, buried crescent, cleaved-coupled cavity laser, the laser 10. The different curves represent different laser section currents in mA. The bottom curve, 30 mA through the laser section, represents operation below the lasing threshold for modulator section currents below about 25 mA. As is apparent, the relationship is nonlinear and there are bumps, i.e., local maxima, in the light output power versus current curves which result from resonant frequency changes of the modulator section cavity of the cleaved-coupled cavity laser as the modulator current is varied. It was found that the peak of each bump corresponds to the optimum modulator current for each selected longitudinal mode. The optimum modulator current is defined as the current that maximizes the longitudinal mode discrimination ratio, i.e., the ratio of the most intense longitudinal mode to the second most intense longitudinal mode. It should also be noted that as the current through the laser section varies, the magnitude of the modulator current required to maintain laser operation at the desired longitudinal mode changes. Thus, a vertical broken line 15 through the peak of a bump in the 50 mA curve is significantly to the left of the peak in the corresponding bump on the 40 mA curve. This aspect of the $C^3$ laser characteristic is utilized to advantage in the present invention.

It is shown by the FIG. 2 inset plot, of laser longitudinal mode discrimination ratio versus first derivative of modulator section output power with respect to modulator section current, that the peak of a bump corresponds to the optimum modulator current for the corresponding modulator section longitudinal mode. As can be seen from the inset, the maximum mode ratio, i.e., the optimum operating point, coincides with the zero value of the derivative. The derivative of $dL/dI_m$ has opposite sign on each side of the zero point; and the illustrated proportional regulator, or feedback loop, including elements 12, 13, 16, and 17 uses $dL/dI_m$ as the error signal to maintain modulator section operation at an optimum point for a mode.

The measuring system of FIG. 1 also includes a stabilization loop for the laser section diode 18 to stabilize operation of that section with respect to environmental effects in the vicinity of a sensor. That sensor is here represented as an optical arrangement for sensing acoustic frequency signals in the presence of noise, in this illustration lower frequency noise, of the environment at the sensing location. Diode 18 is biased by another output from supplies 14 to a level above the lasing threshold of the $C^3$ laser 10. Note that each diode is separately biased with respect to the single lasing threshold of laser 10, and the bias current variations in each diode have effects of different magnitudes on the common wavelength of light emitted by each diode.

Current in diode 18 is modulated by the sin $\omega_1$ output of a sine wave generator 19 through an analog signal adder 20. The output frequency of generator 19 is at a different frequency than that of the generator 17 in the modulator section loop. In order to avoid interaction between the laser section stabilization loop and the modulator section loop, the time constants of these two servo loops are advantageously made sufficiently different, e.g., by corresponding selection of time constants of low pass filter integrators in the feedback circuits of the loops. Light output from diode 18 is applied to a Michelson interferometer 21 via a free or a fiber lightguide path. A single mode fiber path is preferred because the fiber suppresses any spurious light transmission modes that may occur. Interferometer 21 is schematically represented as including a beam splitter 22, a reflecting reference surface 23, and a reflecting sensing surface 26. Many optical arrangements for the interferometer function are known in the art for sensing received signals representing variations in temperature, pressure, physical dimension, or other parameters; and one example is shown in U.S.A. Pat. No. 4,443,106, to M. Morita et al., where it is employed in regard to paint layer thickness. Another example is the Mach-Zehnder interferometer.

Beam splitter 22 directs portions of the diode 18 output to both of the surfaces 23 and 26 via paths of known nominal relative lengths selected so that reflected beams, when recombined, have a predetermined phase relationship when zero signal is being sensed. Reflecting surface 26 is movable, e.g., at a kilohertz rate by acoustic frequency signals that are being sensed, and by environmental-type lower frequency signals, as schematically represented by the bidirectional arrow 28 in FIG. 1. Shielding is typically provided, though not shown in FIG. 1, to prevent factors affecting the beam path 25 to surface 26 from also affecting the beam path to surface 23.

The driving of surface 26 changes the relative lengths of sensing path 25 and reference path 24 in the schematic representation of the interferometer. The maximum change in relative path lengths resulting from those signals must be less than the coherence length of laser 10, i.e. the maximum delay time which can be introduced between the sensing and reference beams before the interference fringes disappear. The total path length difference, including static offset and changes induced by signal and noise between sensing and reference paths, should be less than the coherence length of the laser. If the difference is greater than the coherence length, the two light beams emerging from the interferometer are out of coherence leading to reduced visibility of the interference pattern. Such changes in path length cause corresponding changes in the relative phases of the sensing and reference beams, the development of an interference pattern when the beams are recombined by splitter 22, and corresponding variations in the recombined beam intensity in path 27. That path is advantageously a single mode fiber as before. The recombined beam is sometimes called an interference beam, and it is applied to an output of an optical receiver 29 where the intensity variations are converted to corresponding electrical signal variations. One part of the output of receiver 29 is coupled through a low pass filter 30, with a cutoff frequency just above the highest frequency of signals which are expected to be sensed, as system output signal to any suitable utilization circuit (not shown).

A second part of the output of receiver 29 is fed back to electrical circuits for controlling the bias current of laser section diode 18. A bandpass filter 31, with pass band centered at a frequency of twice the output frequency of generator 19, selects essentially only that double frequency component from the receiver output. Filter 31 output is applied to one input of a mixer 32 which also receives at another input the output of generator 19 by way of a frequency doubler 33. Mixer 32 is used as a phase comparator and produces an error signal output, as in the case of the mixer function mentioned in regard to feedback circuit 13, which is a function of the low frequency environmental effects that tend to distort the sensitivity of the interferometer 21. The error signal is applied to a feedback circuit 36 wherein it is low pass filtered, i.e., integrated, with a long time constant to block out alternating signals, being sensed for output through filter 30 and accumulate the environmental effects at interferometer 21 which are at a very low rate such as a Hertz or less. Circuit 36 also includes a buffer amplifier function for coupling the integrated error signal to an input of the adder 20 for correspondingly modifying laser section diode 18 bias current in a direction tending to reduce the error signal output of mixer 32.

Although laser section diode 18 is already biased above lasing threshold and is usually not considered to be usefully tunable, there is a significant tuning effect as previously indicated. That effect is due to a change in the temperature of the cavity (and a small change in the carrier density) of the laser due to the laser section bias current change, and that temperature change causes corresponding changes in the effective cavity length and the operating wavelength. Thus the bias current changes due to the error signal tend to change the wavelength sufficiently to offset the environmental change in phase of the interferometer due to the path length change in interferometer 21 and thereby preserve the interferometer in maximum sensitivity. To obtain the necessary phase changes of the interferometer by changes in the laser wavelength, the static path length difference of the interferometer must be chosen such that $$\frac{\Delta d}{\lambda^2} \cdot \Delta\lambda > 1,$$

where
  $\Delta d$ = path length difference
  $\lambda$ = laser wavelength
  $\Delta\lambda$ = maximum tuning range of the laser.

Modulator section stabilization loop responds to the wavelength change as previously described to cause a change in bias current in that section to restore laser 10 operation to the optimum operating point for the new wavelength. It can be seen then that this arrangement of dual stabilization loops permits continuous tuning of the laser over a limited range that is more than adequate to compensate for environmental effects as herein outlined, and without risk of mode hopping since the action described of the modulator section stabilization loop restores operation to optimum for the mode.

If the length (d) difference between the sensing and referencing beams is $\Delta d$, the output intensity of the interferometer is given by $$L = L_o(1 + \gamma \cos \Phi),$$

where $$\Phi = \frac{2\pi \Delta d}{\lambda},$$

$\lambda$ is wavelength, and $\gamma$ a coherence factor.

Figure 3:
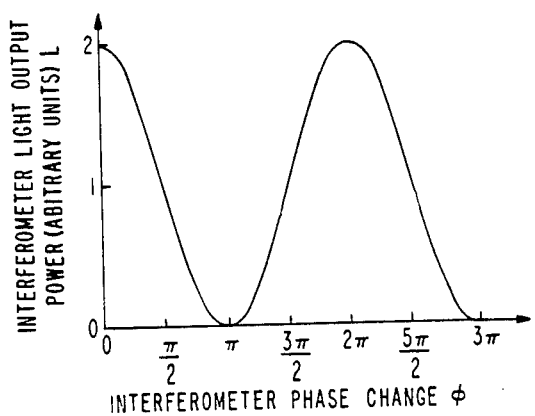
FIG. 3 is a diagram of interferometer light output power versus interferometer phase change for facilitating an understanding of the invention.

FIG. 3 shows the intensity versus the phase difference plot. In order to have a maximum sensitivity for the interferometer, $\Phi$ should be equal to odd multiples of $\pi/2$, i.e., the maximum slope points. This quadrature condition is achieved by tuning the wavlength $\lambda$. At this condition $\partial^2 L/\partial \lambda^2$, which is proportional to $\cos \Phi$, is equal to zero; and because it is zero, it is convenient to use it as a feedback signal.

If $\partial^2 L/\partial \lambda^2$ is used as the error signal for the feedback circuit which controls the current of the laser section, the stability of the feedback condition corresponds to the quadrature condition of the interferometer. To obtain $\partial^2 L/\partial\lambda^2$, the laser wavelength is modulated by modulating the current of the laser diode 18, as was done in the modulator section loop, i.e., $$\lambda = \lambda_o + a \sin \omega t$$

where $\lambda_o$ is the unmodulated laser wavelength, a is the modulation peak amplitude and $a << \lambda_o$. If $L(\lambda)$ is expanded into a Taylor's series, there results $$L(\lambda) = L(\lambda_o) + \left[\frac{\partial L}{\partial \lambda}\right]_{\lambda_o}(\lambda - \lambda_o) +$$

$$\frac{1}{2}\left[\frac{\partial^2 L}{\partial \lambda^2}\right]_{\lambda_o}(\lambda - \lambda_o)^2 + \ldots$$

$$= L(\lambda_o) + C_1\left[\frac{\partial L}{\partial \lambda}\right]_{\lambda_o}\sin \omega \tau +$$

$$C_2\left[\frac{\partial^2 L}{\partial \lambda^2}\right]_{\lambda_o}\left[\frac{\cos 2\omega\tau - 1}{2}\right] + \ldots,$$

where $C_1$ and $C_2$ are constants, and $\omega$ is the modulation frequency. It can now be seen that an error signal demodulated at the modulating frequency $\omega$ is proportional to the first derivative $\partial L/\partial\lambda$ (e.g., the stabilization loop of the modulator section diode 11). However, an error signal demodulated at twice the modulating frequency $2\omega$ is proportional to the second derivative $\partial^2 L/\partial\lambda^2$ (e.g., the laser section diode 18).

By filtering (31) to select the $2\omega_1$ component and demodulating (32) $L(\lambda)$ with reference signal $\sin 2\omega_1\tau$ in FIG. 1, the error signal is made proportional to $$\left[\frac{\partial^2 L}{\partial \lambda^2}\right]_{\lambda_o}.$$

The modulator section stabilization circuit, which maintains the optimal single longitudinal mode operation, is also a servo loop. In order to avoid the interaction between the two servo loops of the illustrated modulator and laser sections, the time constant of the quadrature (laser section) servo operation should be longer than that of the stabilization (modulator section) servo operation.

Figure 4:
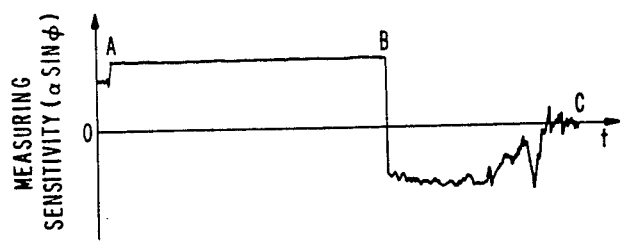
FIG. 4 is a diagram of measuring sensitivity versus time illustrating an advantage of the invention.

A demonstration of an advantage of the operation of the C³ laser with the servo control (laser section feedback) is shown in FIG. 4. The y-axis represents the sensitivity of the interferometer which is proportional to $\sin \Phi$. From time A to time B the servo control is connected; the interferometer has maximum sensitivity and stable operation. From time B to time C the servo control is disconnected; the interferometer becomes unstable; and the sensitivity changes with time.

Although the present invention has been described in connection with a particular embodiment thereof, additional embodiments, modifications, and applications thereof which will be obvious to those skilled in the art are included within the spirit and scope of the invention.

What is claimed is:

1. In a signal sensing system including a laser-driven optical interferometric sensor of signals, the improvement comprising a cleaved-coupled-cavity semiconductor laser having a modulator section and a laser section, means for stabilizing said modulator section for operation below a lasing threshold thereof and at a local peak excursion in the light output versus modulator section current characteristic thereof, means, responsive to light output of said laser section, for energizing said sensor to produce an interference light beam having intensity variations corresponding to variations in said signals, and means, responsive to said interference beam, for stabilizing said laser section for operation above a lasing threshold thereof and at maximum sensitivity of said sensing means.

2. The sensing system in accordance with claim 1 in which said laser section stabilizing means comprises means for applying a periodic modulation at a predetermined frequency to bias current for said laser section, means, responsive to said interference beam, for deriving from that beam an electric signal at a frequency twice that of said periodic modulation, means for mixing with said derived electric signal a signal at a frequency twice that of said periodic modulation, means responsive to an output of said mixing means, for producing an error signal that is a function of the second derivative of beam intensity with respect to wavelength of light output from said laser section, and means for adding said error signal and said periodic modulation to produce said bias current.

3. The sensing system in accordance with claim 2 in which said modulator section stabilizing means includes means for periodically modulating a bias current for said modulator section at a frequency which is different from that of said laser section periodic modulation, both of said periodic modulating signal frequencies being greater than frequencies of said signals sensed by said sensing means.

4. The sensing system in accordance with claim 1 in which one of said stabilizing means includes means for fixing its time constant of operation at a level such that the time constant of operation of said laser section is longer than the time constant of operation of said modulator section.

5. The sensing system in accordance with claim 1 in which said sensor includes an interferometer having a reference light path and a sensing light path, said sensing light path being subject to modification of the effective length thereof by an amount which is less than the coherent length of said C³ laser.

6. In combination:

a cleaved-coupled-cavity semiconductor laser having a modulator section and a laser section, means for stabilizing said modulator section for operation below a lasing threshold thereof and with respect to a first derivative of a light output versus modulator section current characteristics thereof, and means for stabilizing said laser section for operation above a lasing threshold thereof and with respect to a second derivative of a light output versus laser section current characteristic thereof.

7. In a signal sensing system including a laser-driven optical interferometric sensor of signals, the improvement comprising
a cleaved-coupled cavity semiconductor laser having a modulator section and a laser section,
means for stabilizing said laser section and said modulator section with respect to first and second predetermined different functions, respectively, and
means in said stabilizing means for receiving said signals.

* * * * *